United States Patent
Hirao (10) Patent No.: US 11,329,542 B2
(45) Date of Patent: May 10, 2022

(54) SWITCHING REGULATOR

(71) Applicant: SHARP KABUSHIKI KAISHA, Sakai (JP)

(72) Inventor: Kazuma Hirao, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 228 days.

(21) Appl. No.: 16/789,251

(22) Filed: Feb. 12, 2020

(65) Prior Publication Data
US 2020/0280261 A1    Sep. 3, 2020

Related U.S. Application Data (60) Provisional application No. 62/812,531, filed on Mar. 1, 2019.

(51) Int. Cl.
*H02M 3/158*    (2006.01)
*H02M 1/00*    (2006.01)

(52) U.S. Cl.
CPC .......... *H02M 1/0032* (2021.05); *H02M 3/158* (2013.01)

(58) Field of Classification Search
CPC .............................. H02M 1/0032; H02M 3/158
See application file for complete search history.

(56) References Cited

U.S. PATENT DOCUMENTS

| | | | | |
|---|---|---|---|---|
| 7,382,115 | B2* | 6/2008 | Woo | H02M 3/1588 323/282 |
| 8,207,717 | B2* | 6/2012 | Uruno | H02M 3/1582 323/262 |
| 8,520,413 | B2* | 8/2013 | Tran | H02M 3/155 363/21.03 |
| 9,036,386 | B2* | 5/2015 | Earanky | H02M 1/4208 363/89 |
| 9,231,468 | B2* | 1/2016 | Ura | H02M 1/4208 |
| 9,608,515 | B2* | 3/2017 | Meehan | H02M 1/15 |
| 2007/0007935 | A1* | 1/2007 | Johnson | H02M 3/1588 323/282 |
| 2014/0346963 | A1* | 11/2014 | Kang | H05B 45/375 315/200 R |

(Continued)

FOREIGN PATENT DOCUMENTS

JP    2016-131464 A    7/2016

OTHER PUBLICATIONS

Benavides et al. (N. D. Benavides and P. L. Chapman, "Boost Converter with a Reconfigurable Inductor," 2007 IEEE Power Electronics Specialists Conference, 2007, pp. 1695-1700, doi: 10.1109/PESC.2007.4342253. (Year: 2007).*

*Primary Examiner* — Kyle J Moody
(74) *Attorney, Agent, or Firm* — ScienBiziP, P.C.

(57) ABSTRACT

A switching regulator includes a switching element, a rectifier element, an output capacitor having one electrode connected to an output terminal, a control circuit which supplies a pulse width modulation signal in accordance with a voltage of the output terminal to a control terminal of the switching element, a load determination circuit which outputs a determination signal in accordance with a load, based on a voltage of the control terminal of the switching element, and a variable inductance circuit including a plurality of coils and having an inductance value which is switchable based on the determination signal.

10 Claims, 6 Drawing Sheets

(56) References Cited

U.S. PATENT DOCUMENTS

| | | | |
|---|---|---|---|
| 2015/0124490 A1* | 5/2015 | Sanuki | H02M 3/33546 |
| | | | 363/17 |
| 2020/0403507 A1* | 12/2020 | Chan | H02M 1/44 |
| 2021/0111676 A1* | 4/2021 | Kotani | H03F 3/19 |

* cited by examiner

Related Art

Fig. 9

Related Art

SWITCHING REGULATOR

CROSS-REFERENCE TO RELATED APPLICATION

This application claims the benefit of U.S. Provisional Patent Application No. 62/812,531 filed on Mar. 1, 2019, and entitled "Switching Regulator", which is incorporated herein by reference in its entirety.

BACKGROUND OF THE INVENTION

Field of the Invention

The present invention relates to a switching regulator using a chopper method.

Description of Related Art

Switching regulators are widely used as a conversion circuit of a direct current voltage. The switching regulators include those for stepping up an input voltage, those for stepping down the input voltage, those for inverting the input voltage, and the like. In the following, the switching regulator using a chopper method will be considered.

Figure 8:
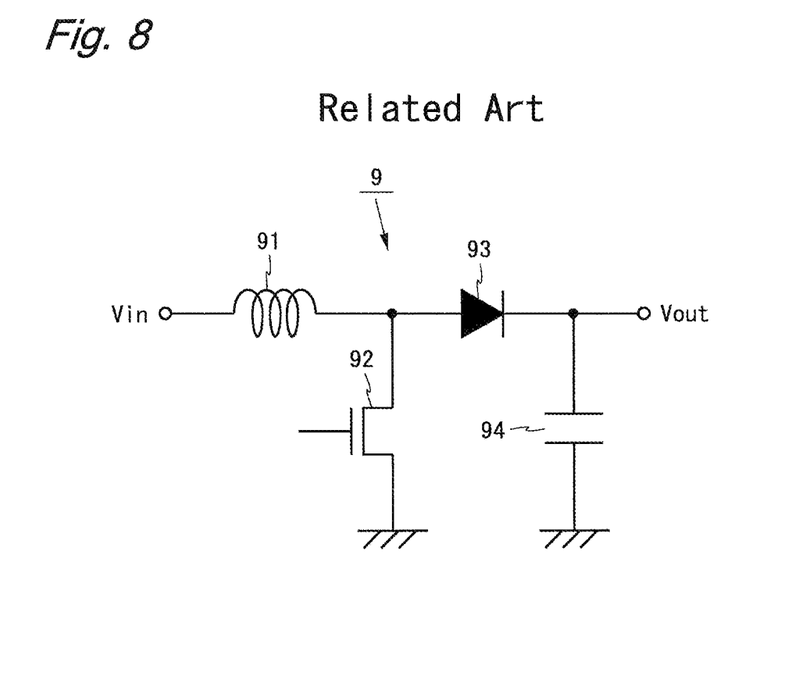
FIG. 8 is a circuit diagram of a conventional switching regulator.

FIG. 8 is a circuit diagram of a conventional step-up switching regulator using the chopper method. A switching regulator 9 shown in FIG. 8 includes a coil 91, a field effect transistor (hereinafter referred to as FET) 92, a diode 93, and a capacitor 94. A pulse width modulation signal is supplied from a control circuit (not shown) to a gate terminal of the FET 92. In an ON period of the FET 92, energy is accumulated in the coil 91. In an OFF period of the FET 92, the energy accumulated in the coil 91 is released to a side of the diode 93. By controlling the FET 92 to an ON state and an OFF state in this manner, an input voltage Vin can be stepped up.

Related to the invention of the present application, Japanese Laid-Open Patent Publication No. 2016-131464 discloses a DC/DC convertor in which a conversion section is connected to a primary winding of a transformer and a rectifier section and a smoothing coil are connected to a secondary winding of the transformer. In the case of a large current, the DC/DC convertor increases an inductance value of the smoothing coil and operates in a continuous mode, and in the case of a small current, the DC/DC convertor decreases the inductance value of the smoothing coil and operates in a discontinuous mode.

Figure 9:
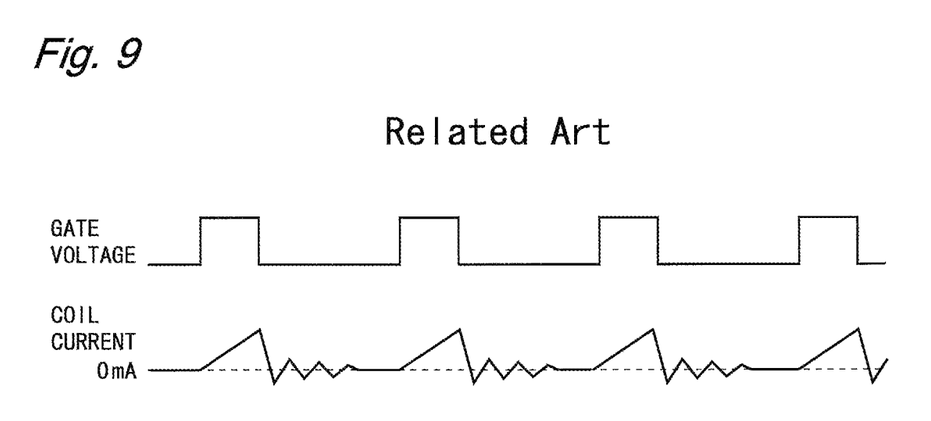
FIG. 9 is a signal waveform diagram of the switching regulator shown in FIG. 8 in the case of the light load.

In the switching regulator 9 shown in FIG. 8, the ON period of the FET 92 is controlled to be long when a load is heavy, and is controlled to be short when the load is light. However, when the load is lighter than a predetermined value, the switching regulator 9 operates in the discontinuous mode (see FIG. 9). In the discontinuous mode, an efficiency of the switching regulator 9 drops.

As a method for making the switching regulator 9 operate in the continuous mode even when the load is light, a method of increasing an inductance value of the coil 91 can be considered. However, when the inductance value of the coil 91 is increased, an amount of current which can flow through the coil 91 decreases. Furthermore, in order to make a same amount of current flow through the coil 91, it is necessary to use a large-sized coil or a high-cost coil. In this manner, the method of increasing the inductance value of the ceil 91 is difficult to apply in fact.

SUMMARY OF THE INVENTION

Therefore, providing a switching regulator which operates efficiently even when a load is light to some extent without greatly increasing circuit size and cost is taken as a problem.

(1) A switching regulator according to some embodiments of the present invention includes: a switching element; a rectifier element; an output capacitor having one electrode connected to an output terminal; a control circuit configured to supply a pulse width modulation signal in accordance with a voltage of the output terminal to a control terminal of the switching element; a load determination circuit configured to output a determination signal in accordance with a load, based on a voltage of the control terminal of the switching element; and a variable inductance circuit including a plurality of coils and having an inductance value which is switchable based on the determination signal.

In the above-described switching regulator, the inductance value of the variable inductance circuit is switched based on the determination signal in accordance with the load. Thus, the switching regulator operates in a continuous mode even when the load is light to some extent. Therefore, a switching regulator which operates efficiently even when the load is light to some extent can be provided without greatly increasing circuit size and cost.

(2) The switching regulator according to some embodiments of the present invention has the configuration of above (1), the variable inductance circuit includes: a first coil; a second coil; and a second switching element connected in parallel with the second coil and configured to turn on when the determination signal indicates a heavy load and to turn off when the determination signal indicates a light load, and the first coil is connected in series with a parallel connection circuit of the second coil and the second switching element.

(3) The switching regulator according to some embodiments of the present invention has the configuration of above (1), the variable inductance circuit includes: a first coil; a second coil; and a second switching element connected in series with the second coil and configured to turn on when the determination signal indicates a heavy load and to turn off when the determination signal indicates a light load, and the first coil is connected in parallel with a series connection circuit of the second coil and the second switching element.

(4) The switching regulator according to some embodiments of the present invention has the configuration of above (1), and the load determination circuit includes an integration circuit configured by a resistor and a capacitor and configured to output an average voltage of the voltage of the control terminal of the switching element.

(5) The switching regulator according to some embodiments of the present invention has the configuration of above (4), and the load determination circuit further includes an inverter configured to output the determination signal based on an output signal of the integration circuit.

(6) The switching regulator according to some embodiments of the present invention has the configuration of above (4), and the load determination circuit further includes a buffer configured to output the determination signal based on an output signal of the integration circuit.

(7) The switching regulator according to some embodiments of the present invention has the configuration of above (4), and the load determination circuit further includes: a resistor divider circuit configured to generate a comparison target voltage based on a reference voltage; and a comparison circuit configured to compare an output voltage of the integration circuit with the comparison target voltage to output the determination signal.

(8) The switching regulator according to some embodiments of the present invention has the configuration of above (1), a first terminal of the variable inductance circuit is connected to an input terminal, a second terminal of the variable inductance circuit, a first conduction terminal of the switching element, and a first terminal of the rectifier element are connected to a first node, a second terminal of the rectifier element is connected to the output terminal, and a second conduction terminal of the switching element and another electrode of the output capacitor are grounded.

(9) The switching regulator according to some embodiments of the present invention has the configuration of above (1), a first conduction terminal of the switching element is connected to an input terminal, a first terminal of the rectifier element and another electrode of the output capacitor are grounded, a second conduction terminal of the switching element, a second terminal of the rectifier element, and a first terminal of the variable inductance circuit are connected to a first node, and a second terminal of the variable inductance circuit is connected to the output terminal.

(10) The switching regulator according to some embodiments of the present invention has the configuration of above (1), a first conduction terminal of the switching element is connected to an input terminal, a first terminal of the rectifier element is connected to the output terminal, a second conduction terminal of the switching element, a second terminal of the rectifier element, and a first terminal of the variable inductance circuit are connected to a first node, and a second terminal of the variable inductance circuit and another electrode of the output capacitor are grounded.

(11) The switching regulator according to some embodiments of the present invention has the configuration of above (1), and the rectifier element is a diode.

These and other objects, features, modes and effects of the present invention will be more apparent from the following detailed description with reference to the attached drawings.

DETAILED DESCRIPTION OF THE INVENTION

First Embodiment

Figure 1:
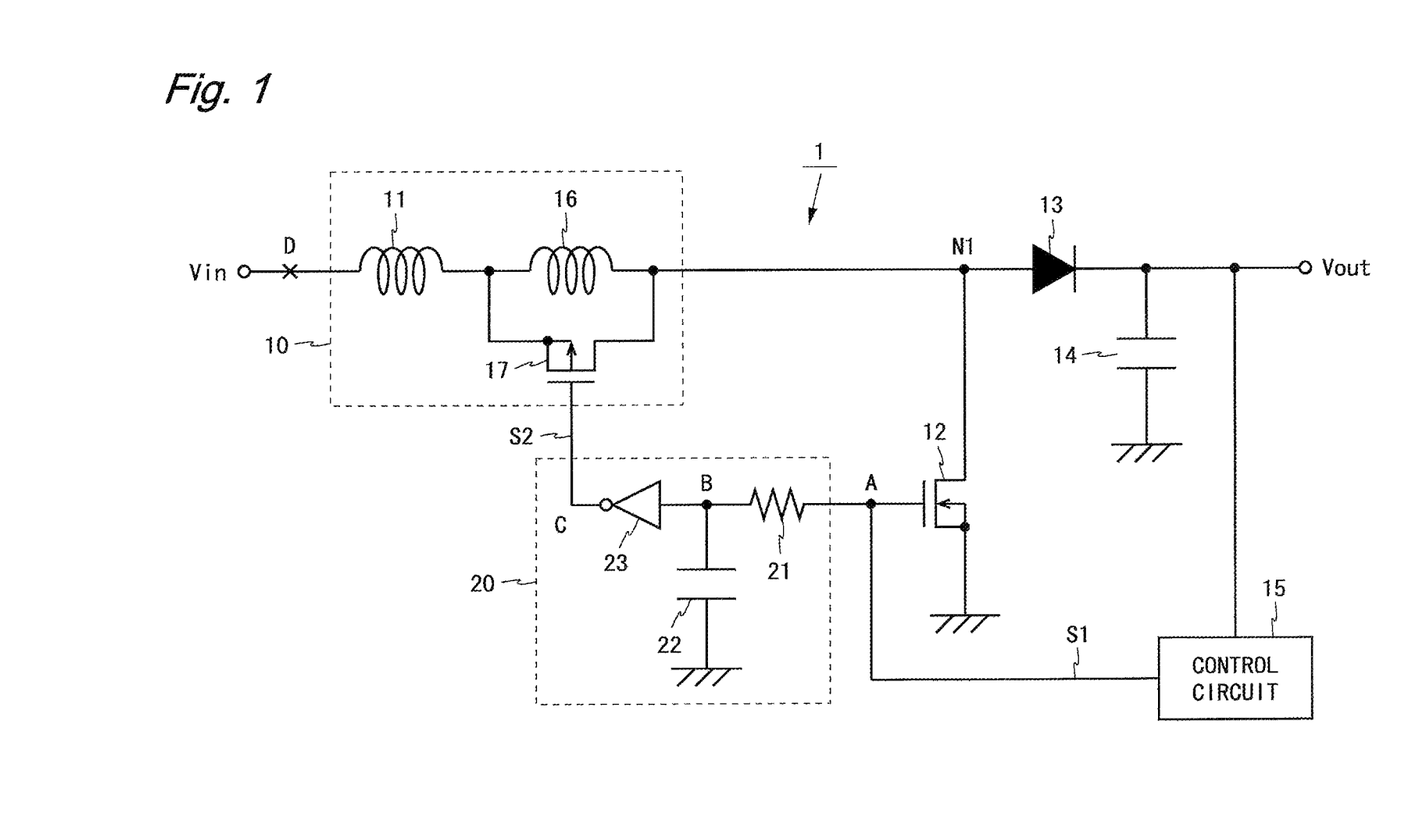
FIG. 1 is a circuit diagram of a switching regulator according to a first embodiment.

FIG. 1 is a circuit diagram of a switching regulator according to a first embodiment. A switching regulator 1 shown in FIG. 1 includes a variable inductance circuit 10 (including two coils 11, 16), an FET 12, a diode 13, a capacitor 14, a control circuit 15, and a load determination circuit 20. The FET 12 is an N-channel type FET and functions as a switching element. The diode 13 functions as a rectifier element, and the capacitor 14 functions as an output capacitor. The control circuit 15 is typically included in a switching regulator IC. The switching regulator 1 is obtained based on a general step-up switching regulator using a chopper method by replacing the coil 11 with the variable inductance circuit 10 and adding the load determination circuit 20.

As shown in FIG. 1, the variable inductance circuit 10 includes the coils 11, 16 and an FET 17. The coil 11 functions as a first coil, and the coil 16 functions as a second coil. The FET 17 is a P-channel type FET and functions as a second switching element. One end (left-side terminal) of the coil 11 is connected to an input terminal of the switching regulator 1. Another end of the coil 11 is connected to one end (left-side terminal) of the coil 16. Another end of the coil 16 is connected to a drain terminal of the FET 12 and an anode terminal of the diode 13. A drain terminal and a source terminal of the FET 17 are connected to the two ends of the coil 16, respectively.

In this manner, the FET 17 is connected in parallel with the coil 16. The coil 11 is connected in series with a parallel connection circuit of the coil 16 and the FET 17. A first terminal (left-side terminal) of the variable inductance circuit 10 is connected to the input terminal of the switching regulator 1. A second terminal of the variable inductance circuit 10 is connected to the drain terminal of the FET 12 and the anode terminal of the diode 13.

A cathode terminal of the diode 13 is connected to one electrode (upper-side electrode) of the capacitor 14 and an output terminal of the switching regulator 1. A source terminal of the FET 12 and another electrode of the capacitor 14 are grounded.

An input terminal of the control circuit 15 is connected to the output terminal the switching regulator 1, and an output terminal of the control circuit 15 is connected to a gate terminal of the FET 12. The control circuit 15 supplies, to the gate terminal of the FET 12, a pulse width modulation signal S1 in accordance with a voltage Vout of the output terminal of the switching regulator 1. The voltage Vout changes in accordance with a load (not shown) connected to the output terminal of the switching regulator 1. Therefore, it can be said that the control circuit 15 supplies the pulse width modulation signal S1 in accordance with the load to the gate terminal of the FET 12. As the load is larger, the control circuit 15 controls a high-level period of the pulse width modulation signal S1 to be longer.

The load determination circuit 20 includes a resistor 21, a capacitor 22, and an inverter 23. One end (right-side terminal) of the resistor 21 is connected to the gate terminal of the FET 12. Another end of the resistor 21 is connected to one electrode (upper-side electrode) of the capacitor 22 and an input terminal of the inverter 23. Another electrode of the capacitor 22 is grounded. The resistor 21 and the capacitor 22 function as an integration circuit which outputs an average voltage of a gate voltage of the FET 12. An output signal of the integration circuit is input to the input terminal of the inverter 23. The inverter 23 is a CMOS inverter, for example, outputs a high-level voltage VH when an input voltage is lower than a threshold voltage, and outputs a low-level voltage VL when the input voltage is higher than the threshold voltage. An output terminal of the inverter 23 is connected to a gate terminal of the FET 17.

In the following, a case where the load is larger than a predetermined value is referred to as "heavy load", and a case where the load is smaller than the predetermined value is referred to as "light load". The above-described predetermined value is determined by a resistance value of the resistor 21, a capacitance value of the capacitor 22, the threshold voltage of the inverter 23, and the like. Furthermore, an inductance value of the variable inductance circuit 10 is denoted by H1. In the following, as an example, it is assumed that the high-level voltage VH is 3.3 V, the low-level voltage VL is 0 V (ground voltage), an inductance value of the coil 11 is 10 µH, an inductance value of the coil 16 is 100 µH, capacitance values of the capacitors 14, 22 are 10 µF, and the resistance value of the resistor 21 is 10 kΩ.

Figure 2:
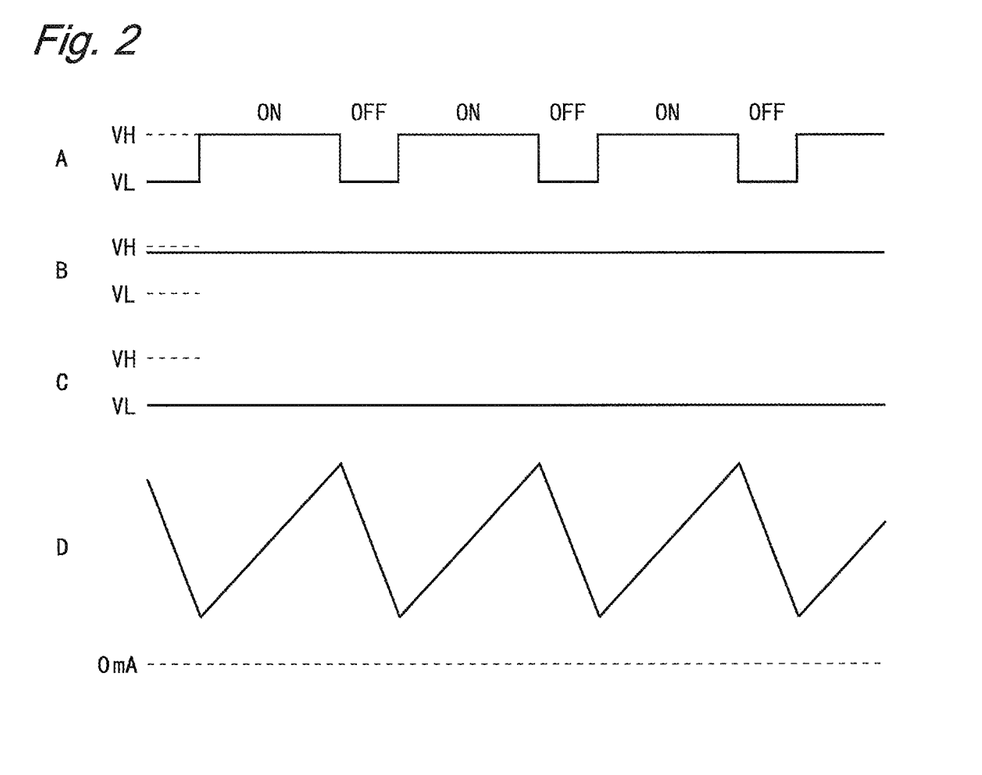
FIG. 2 is a signal waveform diagram of the switching regulator shown in FIG. 1 in the case of a heavy load.
Figure 3:
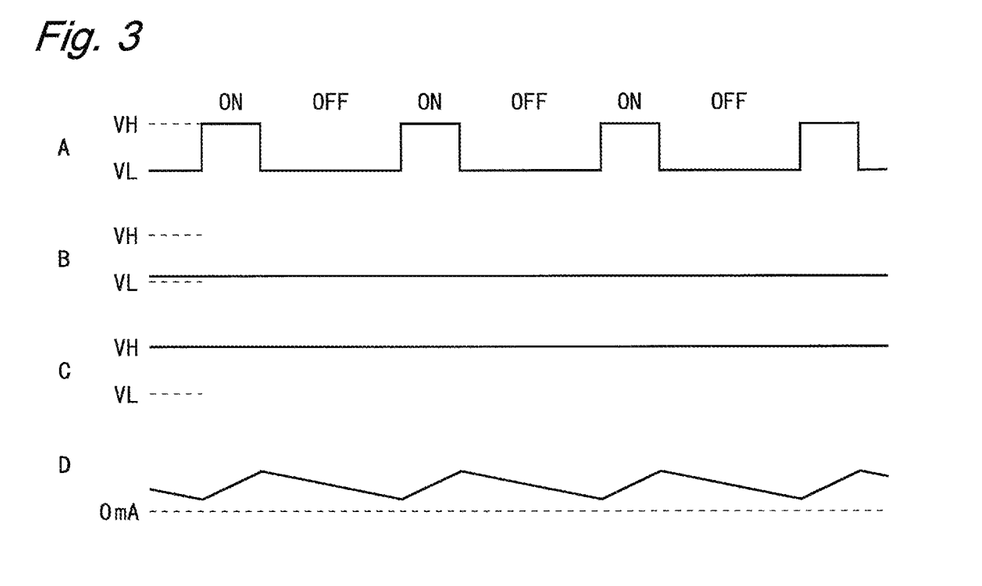
FIG. 3 is a signal waveform diagram of the switching regulator shown in FIG. 1 in the case of a light load.

FIG. 2 is a signal waveform diagram of the switching regulator 1 in the case of the heavy load. FIG. 3 is a signal waveform diagram of the switching regulator 1 in the case of the light load. In FIG. 1, a node connected to the gate terminal of the FET 12 is referred to as A, a node connected to the input terminal of the inverter 23 is referred to as B, a node connected to the output terminal of the inverter 23 is referred to as C, and a node connected to the input terminal of the switching regulator 1 is referred to as D. FIGS. 2 and 3 describe a state of the FET 12, voltages of the nodes A to C, and a current flowing through the node D.

In the case of the heavy load (FIG. 2), in order to increase a current flowing through the coil 11, the control circuit 15 controls a high-level period of the gate voltage of the FET 12 (voltage of the node A) to be long. Thus, an output voltage of the integration circuit (voltage of the node B) comes close to the high-level voltage VH, and an output signal S2 of the inverter 23 (voltage of the node C) becomes low-level. Since the FET 17 turns on at this time, the current flowing through the coil 11 flows through the FET 17, but does not flow through the coil 16. Therefore, the inductance value H1 in the case of the heavy load is equal to the inductance value of the coil 11 (10 µH). The current flowing through the node D changes rapidly in accordance with the inductance value H1 which is relatively small. At this time, the switching regulator 1 operates in a continuous mode.

In the case of the light load (FIG. 3), in order to decrease the current flowing through the coil 11, the control circuit 15 controls the high-level period of the gate voltage of the FET 12 to be short. Thus, the output voltage of the integration circuit comes close to the low-level voltage VL, and the output signal S2 of the inverter 23 becomes high-level. Since the FET 17 turns off at this time, the current flowing through the coil 11 flows through the coil 16, but does not flow through the FET 17. Therefore, the inductance value H1 in the case of the light load is equal to a sum of the inductance value of the coil 11 and the inductance value of the coil 16 (110 µH). The current flowing through the node D changes slowly in accordance with the inductance value H1 which is relatively large. Also in the case shown in FIG. 3, the switching regulator 1 operates in the continuous mode.

In this manner, in the case of the heavy load, the load determination circuit 20 outputs a low-level determination signal S2, and the FET 17 turns on based on the determination signal S2. At this time, the inductance value H1 becomes a relatively small value, and the switching regulator 1 operates in the continuous mode. In the case of the light lead, the load determination circuit 20 outputs a high-level determination signal S2, and the FET 17 turns off based on the determination signal S2. At this time, the inductance value H1 becomes a relatively large value. Therefore, the switching regulator 1 operates in the continuous mode even when the load is light to some extent.

In the following, a circuit obtained by removing the coil 16, the FET 17, and the load determination circuit 20 from the switching regulator 1 is considered as a switching regulator according to a first comparative example. In the switching regulator according to the first comparative example, it is assumed that an optimum value of the inductance value of the coil 11 in the case of the heavy load is 10 µH. The switching regulator according to the first comparative example operates in the continuous mode in the case of the heavy load, but operates in a discontinuous mode in the case of the light load. Thus, in the switching regulator according to the first comparative example, an efficiency drops in the case of the light load.

Next, a circuit obtained by removing the FET 17 and the load determination circuit 20 from the switching regulator 1 is considered as a switching regulator according to a second comparative example. In the switching regulator according to the second comparative example, the coil 11 of 10 µH and the coil 16 of 100 µH are connected in series. The switching regulator according to the second comparative example operates in the continuous mode even when the load is light to some extent. However, the switching regulator according to the second comparative example has a problem that size and cost of the coil 16 are increased, as described below.

For example, it is assumed that the switching regulator performs three-fold step-up, an output current is 100 mA, and a conversion efficiency is 80%. In this case, an input current is 300 mA, and an average current flowing through the coils 11, 16 is 375 mA. Considering that the current flowing through the coils 11, 16 is a triangle wave, that it is necessary to instantly correspond to an abrupt change of the load, and that it is necessary to provide a margin, the coils 11, 16 need to have a current capacitance which is about five times of the average current (current capacitance of about 2 A).

A coil having an inductance value of 10 µH and a current capacitance of 2 A is sold in a market. The size of the coil is about 5 mm square. However, if the inductance value is to be changed to 100 µH without changing the size of the coil, only a coil having a current capacitance of 0.74 A is sold in the market. Furthermore, even if the size of the coil is permitted to be less than about 13 mm square, only a coil having an inductance value of 100 µH and a current capacitance of 1.4 A is sold in the market. In this manner, the switching regulator according to the second comparative example has a problem that the size and the cost of the coil 16 are increased.

In the switching regulator 1 according to the present embodiment, it is only in the case of the light load when the current flows through the coil 16. Thus, when the load determination circuit 20 which makes the FET 17 turn off when the load is ⅓ of that in the case of the heavy load is used, only a current of at most a little less than 700 mA flows through the coil 16. Therefore, by using the coil having the inductance value of 10 µH, the current capacitance of 2 A, and the size of 5 mm square, and the coil having the inductance value of 100 µH, the current capacitance of 0.74 A, and the size of 5 mm square which are described above, the switching regulator 1 which operates efficiently even when the load is light to some extent can be configured without greatly increasing the size and the cost.

As described above, the switching regulator 1 according the present embodiment includes a switching element (FET 12), a rectifier element (diode 13), an output capacitor (capacitor 14) having one electrode connected to the output terminal, the control circuit 15 which supplies the pulse width modulation signal S1 in accordance with the voltage Vout of the output terminal to a control terminal of the switching element (gate terminal of the FET 12), the load determination circuit 20 which outputs the determination signal S2 in accordance with the load, based on a voltage of the control terminal of the switching element, and the variable inductance circuit 10 including a plurality of coils 11, 16 and having the inductance value which is switchable based on the determination signal S2.

In the switching regulator 1 according to the present embodiment, the inductance value H1 of the variable inductance circuit 10 is switched based on the determination signal S2 in accordance with the load. Thus, the switching regulator 1 operates in the continuous mode even when the load is light to some extent. Therefore, the switching regulator which operates efficiently even when the load is light to some extent can be provided without greatly increasing the circuit size and the cost.

The variable inductance circuit 10 includes a first coil (coil 11), a second coil (coil 16), a second switching element (FET 17) which is connected in parallel with the second coil, turns on when the determination signal S2 indicates the heavy load, and turns off when the determination signal S2 indicates the light load, and the first coil is connected in series with a parallel connection circuit of the second coil and the second switching element. Therefore, the variable inductance circuit 10 having the inductance value which is switchabie based on the determination signal S2 can be configured easily.

The load determination circuit 20 includes the integration circuit which is configured by the resistor 21 and the capacitor 22 and outputs an average voltage of the voltage of the control terminal of the switching element, and the inverter 23 which outputs the determination signal S2 based on the output signal of the integration circuit. Therefore, the load determination circuit 20 which outputs the determination signal S2 in accordance with the load can be configured easily by using the integration circuit and the inverter 23.

A first terminal of the variable inductance circuit 10 is connected to the input terminal, a second terminal of the variable inductance circuit 10, a first conduction terminal of the switching element (drain terminal of the FET 12), and a first terminal of the rectifier element (anode terminal of the diode 13) are connected to a first node (N1 shown in FIG. 1), a second terminal of the rectifier element (cathode terminal of the diode 13) is connected to the output terminal, a second conduction terminal of the switching element (source terminal of the FET 12) and another electrode of the output capacitor are grounded. Therefore, a step-up switching regulator which operates efficiently even when the load is light to some extent can be provided. Furthermore, the rectifier element is the diode 13. Therefore, the switching regulator which operates efficiently even when the load is light to some extent can be provided using the diode 13 as the rectifier element.

Second Embodiment

Figure 4:
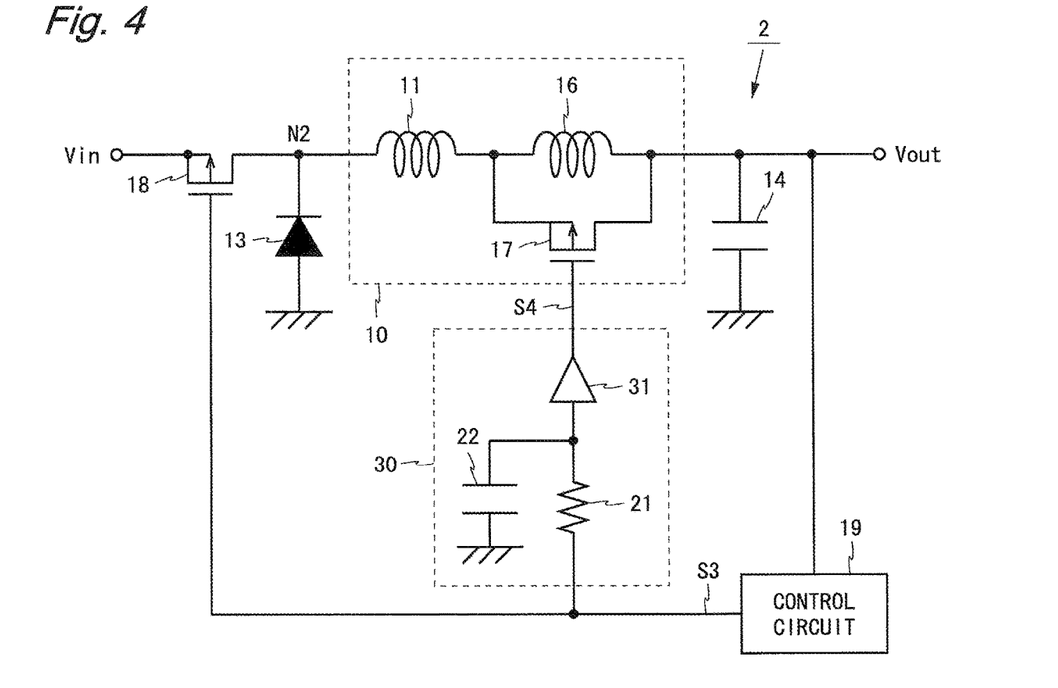
FIG. 4 is a circuit diagram of a switching regulator according to a second embodiment.

FIG. 4 is a circuit diagram of a switching regulator according to a second embodiment. A switching regulator 2 shown in FIG. 4 includes the variable inductance circuit 10 (including the two coils 11, 16), an FET 18, the diode 13, the capacitor 14, a control circuit 19, and a load determination circuit 30. The FET 18 is a P-channel type FET and functions as a switching element. The switching regulator 2 is obtained based on a general step-down switching regulator using the chopper method by replacing the coil 11 with the variable inductance circuit 10 and adding the load determination circuit 30. In the following embodiments, same elements as those described in any preceding embodiment are provided with the same reference numbers and description thereof is omitted.

As shown in FIG. 4, the configuration of the variable inductance circuit 10 is same as that of the first embodiment A source terminal (left-side terminal) of the FET 18 is connected to an input terminal of the switching regulator 2. A drain terminal of the FET 18 is connected to the first terminal (left-side terminal) of the variable inductance circuit 10 and the cathode terminal of the diode 13. The second terminal of the variable inductance circuit 10 is connected to one electrode (upper-side electrode) of the capacitor 14 and an output terminal of the switching regulator 2. The anode terminal of the diode 13 and another electrode of the capacitor 14 are grounded.

An input terminal of the control circuit 19 is connected to the output terminal of the switching regulator 2, and an output terminal of the control circuit 19 is connected to a gate terminal of the FET 18. The control circuit 19 supplies a pulse width modulation signal S3 in accordance with a voltage Vout of the output terminal of the switching regulator 2 (pulse width modulation signal in accordance with the load) to the gate terminal of the FET 18. As the load is larger, the control circuit 19 controls a low-level period of the pulse width modulation signal S3 to be longer.

The load determination circuit 30 includes the resistor 21, the capacitor 22, and a buffer 31. One end (lower-side terminal) of the resistor 21 is connected to the gate terminal of the FET 18. Another end of the resistor 21 is connected to one electrode (upper-side electrode) of the capacitor 22 and an input terminal of the buffer 31. Another electrode of the capacitor 22 is grounded. The integration circuit configured by the resistor 21 and the capacitor 22 outputs an average voltage of a gate voltage of the FET 18. The output signal of the integration circuit is input to an input terminal of the buffer 31. The buffer 31 is a CMOS buffer, for example, outputs the low-level voltage VL when an input voltage is lower than a threshold voltage, and outputs the high-level voltage VH when the input voltage is higher than the threshold voltage. An output terminal of the buffer 31 is connected to the gate terminal of the FET 17.

In the case of the heavy load, in order to increase the current flowing through the coil 11, the control circuit 19 controls a low-level period of the gate voltage of the FET 18 to be long. Thus, the output voltage of the integration circuit comes close to the low-level voltage VL, and an output signal S4 of the buffer 31 becomes low-level. Since the FET 17 turns on at this time, the current flowing through the coil 11 flows through the FET 17, but does not flow through the coil 16. Therefore, the inductance value H1 in the case of the heavy load is equal to the inductance value of the coil 11.

In the case of the light load, in order to decrease the current flowing through the coil 11, the control circuit 19 controls the low-level period of the gate voltage of the FET 18 to be short. Thus, the output voltage of the integration circuit comes close to the high-level voltage VH, and the output signal S4 of the buffer 31 becomes high-level. Since the FET 17 turns off at this time, the current flowing through the coil 11 flows through the coil 16, but does not flow through the FET 17. Therefore, the inductance value H1 in the case of the light load is equal to the sum of the inductance value of the coil 11 and the inductance value of the coil 16.

In this manner, in the case of the heavy load, the load determination circuit 30 outputs a low-level determination signal S4, and the FET 17 turns on based on the determination signal S4. At this time, the inductance value H1 becomes a relatively small value, and the switching regulator 2 operates in the continuous mode. In the case of the light load, the load determination circuit 30 outputs a high-level determination signal 34, and the FET 17 turns off based on the determination signal S4. At this time, the inductance value H1 becomes a relatively large value. Therefore, the switching regulator 2 operates in the continuous mode even when the load is light to some extent.

As described above, in the switching regulator 2 according to the present embodiment, the load determination circuit 30 includes the integration circuit which is configured by the resistor 21 and the capacitor 22 and outputs the average voltage of the voltage of the control terminal of the switching element, and the buffer 31 which outputs the determination signal S4 based on the output signal of the integration circuit. Therefore, the load determination circuit 30 which outputs the determination signal S4 in accordance with the load can be configured easily by using the integration circuit and the buffer 31.

In the switching regulator 2 according to the present embodiment, a first conduction terminal of the switching element (source terminal of the FET 18) is connected to the input terminal, a first terminal of the rectifier element (anode terminal of the diode 13) and another electrode of the output capacitor (capacitor 14) are grounded, a second conduction terminal of the switching element (drain terminal of the FET 18), a second terminal of the rectifier element (cathode terminal of the diode 13), and a first terminal of the variable inductance circuit 10 are connected to a first node (N2 shown in FIG. 4), and a second terminal of the variable inductance circuit 10 is connected to the output terminal. Therefore, according to the switching regulator 2 according to the present embodiment, as with the first embodiment, a step-down switching regulator which operates efficiently even when the load is light to some extent can be provided without greatly increasing the circuit size and the cost.

Third Embodiment

Figure 5:
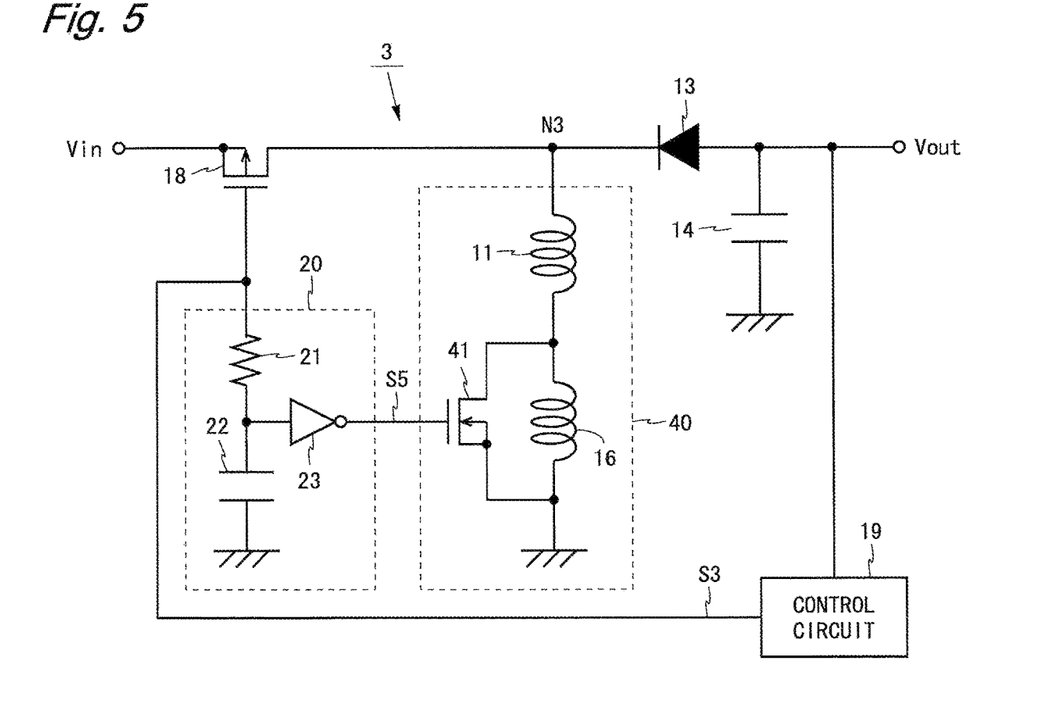
FIG. 5 is a circuit diagram of a switching regulator according to a third embodiment.

FIG. 5 is a circuit diagram of a switching regulator according to a third embodiment. A switching regulator 3 shown in FIG. 5 includes a variable inductance circuit 40 (including the two coils 11, 16), the FET 18, the diode 13, the capacitor 14, the control circuit 19, and the load determination circuit 20. The switching regulator 3 is obtained based on a general inverting switching regulator using the chopper method by replacing the coil 11 with the variable inductance circuit 40 and adding the load determination circuit 20.

As shown in FIG. 5, the variable inductance circuit 40 is obtained by replacing the FET 17 in the variable inductance circuit 10 with an FET 41. The FET 41 is an N-channel type FET and functions as a second switching element. In the following, an inductance value of the variable inductance circuit 40 is denoted by H2.

The source terminal (left-side terminal) of the FET 18 is connected to an input terminal of the switching regulator 3. The drain terminal of the FET 18 is connected to a first terminal (upper-side terminal) of the variable inductance circuit 40 and the cathode terminal of the diode 13. The anode terminal of the diode 13 is connected to one electrode (upper-side electrode) of the capacitor 14 and an output terminal of the switching regulator 3. A second terminal of the variable inductance circuit 40 and another electrode of the capacitor 14 are grounded.

The input terminal of the control circuit 19 is connected to the output terminal of the switching regulator 3, and the output terminal of the control circuit 19 is connected to the gate terminal of the FET 18. The operation of the control circuit 19 is same as that of the second embodiment. The configuration of the load determination circuit 20 is same as that of the first embodiment. The output terminal of the inverter 23 is connected to a gate terminal of the FET 41.

In the case of the heavy load, in order to increase the current flowing through the coil 11, the control circuit 19 controls the low-level period of the gate voltage of the FET 18 to be long. Thus, the output voltage of the integration circuit configured by the resistor 21 and the capacitor 22 comes close to the low-level voltage VL, and an output signal S5 of the inverter 23 becomes high-level. Since the FET 41 turns on at this time, the current flowing through the coil 11 flows through the FET 41, but does not flow through the coil 16. Therefore, the inductance value H2 in the case of the heavy load is equal to the inductance value of the coil 11.

In the case of the light load, in order to decrease the current flowing through the coil 11, the control circuit 19 controls the low-level period of the gate voltage of the FET 18 to be short. Thus, the output voltage of the integration circuit comes close to the high-level voltage VH, and the output signal S5 of the inverter 23 becomes low-level. Since the FET 41 turns off at this time, the current flowing through the coil 11 flows through the coil 16, but does not flow through the FET 41. Therefore, the inductance value H2 in the case of the light load is equal to the sum of the inductance value of the coil 11 and the inductance value of the coil 16.

In this manner, in the case of the heavy load, the load determination circuit 20 outputs a high-level determination signal S5, and the FET 41 turns on based on the determination signal S5. At this time, the inductance value H2 becomes a relatively small value, and the switching regulator 3 operates in the continuous mode. In the case of the light load, the load determination circuit 20 outputs a low-level determination signal S5, and the FET 41 turns off based on the determination signal S5. At this time, the inductance value H2 becomes a relatively large value. Therefore, the switching regulator 3 operates in the continuous mode even when the load is light to some extent.

As described above, in the switching regulator 3 according to the present embodiment, a first conduction terminal of the switching element (source terminal of the FET 18) is connected to the input terminal, a first terminal of the rectifier element (anode terminal of the diode 13) is connected to the output terminal, a second conduction terminal of the switching element (drain terminal of the FET 18), a second terminal of the rectifier element (cathode terminal of the diode 13), and a first terminal of the variable inductance circuit 40 are connected to a first node (N3 shown in FIG. 5), and a second terminal of the variable inductance circuit 40 and another electrode of the output capacitor (capacitor 14) are grounded. Therefore, according to the switching regulator 3 according to the present embodiment, as with the first and second embodiments, an inverting switching regulator which operates efficiently even when the load is light to some extent can be provided without greatly increasing the circuit size and the cost.

Fourth Embodiment

Figure 6:
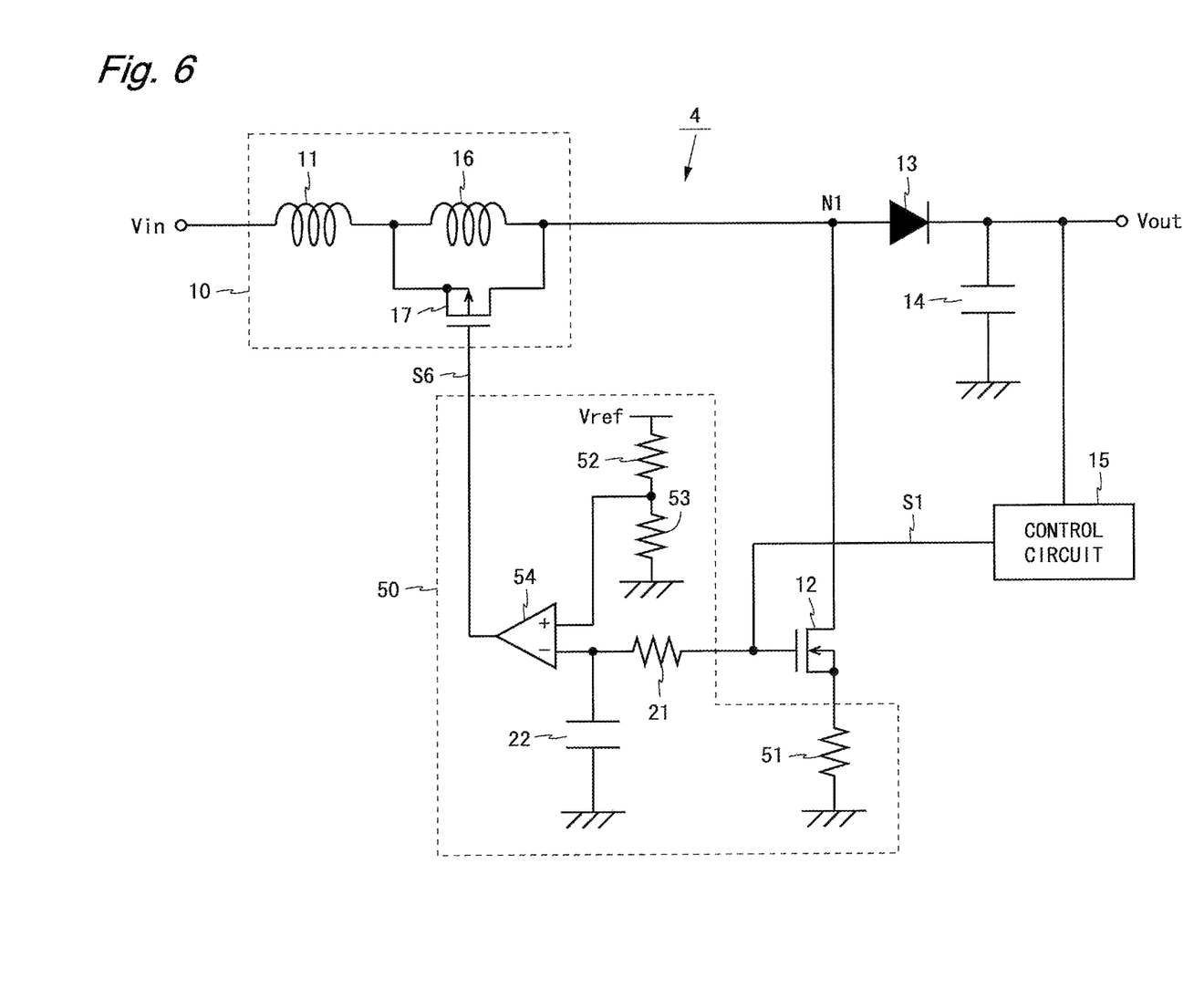
FIG. 6 is a circuit diagram of a switching regulator according to a fourth embodiment.

FIG. 6 is a circuit diagram of a switching regulator according to a fourth embodiment. A switching regulator 4 shown in FIG. 6 is obtained by replacing the load determination circuit 20 in the switching regulator 1 according to the first embodiment with a load determination circuit 50.

As shown in FIG. 6, the load determination circuit 50 includes resistors 21, 51 to 53, the capacitor 22, and a comparison circuit 54. One end (upper-side terminal) of the resistor 51 is connected to the source terminal of the FET 12. One end (right-side terminal) of the resistor 21 is connected to the gate terminal of the FET 12. Another end of the resistor 21 is connected to one electrode (upper-side electrode) of the capacitor 22 and a minus-side input terminal of the comparison circuit 54. A reference voltage Vref is supplied to one end (upper-side terminal) of the resistor 52. Another end of the resistor 52 is connected to one end (upper-side terminal) of the resistor 53 and a plus-side input terminal of the comparison circuit 54. Another electrode of the capacitor 22 and another ends of the resistors 51, 53 are grounded. An output terminal of the comparison circuit 54 is connected to the gate terminal of the FET 17. The resistors 52, 53 function as a resistor divider circuit which generates a comparison target voltage based on the reference voltage Vref.

In the case of the heavy load, in order to increase the current flowing through the coil 11, the control circuit 15 controls the high-level period of the gate voltage of the FET 12 to be long. Thus, the output voltage of the integration circuit configured by the resistor 21 and the capacitor 22 comes close to the high-level voltage VH, and an output voltage of the comparison circuit 54 becomes low. Since the FET 17 turns on at this time, the current flowing through the coil 11 flows through the FET 17, but does not flow through the coil 16. Therefore, the inductance value H1 in the case of the heavy load is equal to the inductance value of the coil 11.

In the case of the light load, in order to decrease the current flowing through the coil 11, the control circuit 15 controls the high-level period of the gate voltage of the FET 12 to be short. Thus, the output voltage of the integration circuit comes close to the low-level voltage VL, and the output voltage of the comparison circuit 54 becomes high. Since the FET 17 turns off at this time, the current flowing through the coil 11 flows through the coil 16, but does not flow through the FET 17. Therefore, the inductance value H1 in the case of the light load is equal to the sum of the inductance value of the coil 11 and the inductance value of the coil 16.

In this manner, in the case of the heavy load, the load determination circuit 50 outputs the determination signal S6 having a low voltage level, and the FET 17 turns on based on the determination signal S6. At this time, the inductance value H1 becomes a relatively small value, and the switching regulator 4 operates in the continuous mode. In the case of the light load, the load determination circuit 50 outputs the determination signal S6 having a high voltage level, and the FET 17 turns off based on the determination signal S6. At this time, the inductance value H1 becomes a relatively large value. Therefore, the switching regulator 4 operates in the continuous mode even when the load is light to some extent.

As described above, in the switching regulator 4 according to the present embodiment, the load determination circuit 50 includes the integration circuit which is configured by the resistor 21 and the capacitor 22 and outputs the average voltage of the voltage of the control terminal of the switching element, a resistor divider circuit (resistors 52, 53) which generates a comparison target voltage based on the reference voltage Vref, and the comparison circuit 54 which compares the output voltage of the integration circuit with the comparison target voltage to output the determination signal S6. Therefore, the load determination circuit 50 which outputs the determination signal S6 in accordance with the load can be configured easily by using the integration circuit, the resistor divider circuit, and the comparison circuit 54.

Fifth Embodiment

Figure 7:
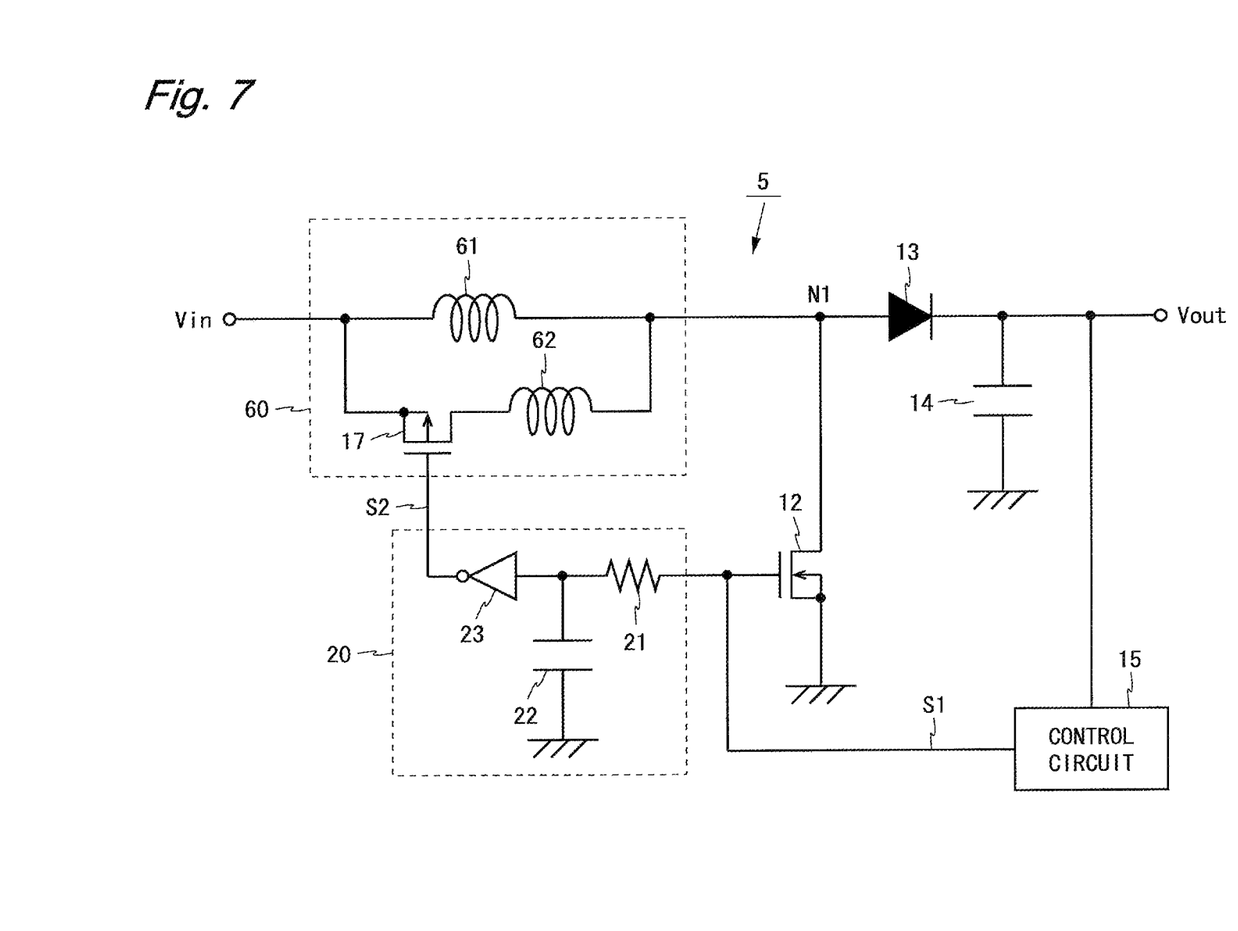
FIG. 7 is a circuit diagram of a switching regulator according to a fifth embodiment.

FIG. 7 is a circuit diagram of a switching regulator according to a fifth embodiment. A switching regulator 5 shown in FIG. 7 is obtained by replacing the variable inductance circuit 10 in the switching regulator 1 according to the first embodiment with a variable inductance circuit 60. In the following, an inductance value of the variable inductance circuit 60 is denoted by H3.

As shown in FIG. 7, the variable inductance circuit 60 includes coils 61, 62 and the FET 17. The coil 61 functions as a first coil, and the coil 62 functions as a second coil. One end (left-side terminal) of the coil 61 and the source terminal of the FET 17 are connected to an input terminal of the switching regulator 5. The drain terminal of the FET 17 is connected to one end (left-side terminal) of the coil 62. Another end of the coil 61 and another end of the coil 62 are connected to the drain terminal of the FET 12 and the anode terminal of the diode 13.

In this manner, the FET 17 is connected in series with the coil 62. The coil 61 is connected in parallel with a series connection circuit of the coil 62 and the FET 17. A first terminal (left-side terminal) of the variable inductance circuit 60 is connected to the input terminal of the switching regulator 5. A second terminal of the variable inductance circuit 60 is connected to the drain terminal of the FET 12 and the anode terminal of the diode 13. In the following, as an example, it is assumed that an inductance value of the coil 61 is 100 µH, and an inductance value of the coil 62 is 10 µH.

As with the first embodiment, in the case of the heavy load, the output signal S2 of the inverter 23 becomes low-level. Since the FET 17 turns on at this time, a current flows through both of the coils 61, 62. Therefore, the inductance value H3 in the case of the heavy load is equal to a composite inductance value of the coils 61, 62 connected in parallel (9 µH). In the case of the light load, the output signal S2 of the inverter 23 becomes high-level. Since the FET 17 turns off at this time, the current flows only through the coil 61. Therefore, the inductance value H3 in the case of the light load is equal to the inductance value of the coil 61 (100 µH).

In this manner, in the case of the heavy load, the load determination circuit 20 outputs the low-level determination signal S2, and the FET 17 turns on based on the determination signal S2. At this time, the inductance value H3 becomes a relatively small value, and the switching regulator 5 operates in the continuous mode. In the case of the light load, the load determination circuit 20 outputs the high-level determination signal S2, and the FET 17 turns off based on the determination signal S2. At this time, the inductance value H3 becomes a relatively large value. Therefore, the switching regulator 5 operates in the continuous mode even when the load is light to some extent.

As described above, in the switching regulator 5 according to the present embodiment, the variable inductance circuit 60 includes a first coil (coil 61), a second coil (coil 62), a second switching element (FET 17) which is connected in parallel with the second coil, turns on when the determination signal S2 indicates the heavy load, and turns off when the determination signal S2 indicates the light load, and the first coil is connected in parallel with a series connection circuit of the second coil and the second switching element. Therefore, the variable inductance circuit 60 having an inductance value which is switchable based on the determination signal S2 can be configured easily.

As for the above-described switching regulators, various kinds of modifications can be configured. For example, switching regulators according to modifications of the second to fourth embodiments may include the same variable inductance circuit as that of the fifth embodiment. Furthermore, in a variable inductance circuit of a switching regulator according to a modification, a first coil, and a parallel connection circuit of a second coil and a second switching element may be connected in a reverse order, or the second coil and the second switching element may be connected in a reverse order. Furthermore, a switching regulator according to a modification may include an FET which makes a current flow in a same direction as the diode 13 when it is ON, as the rectifier element in place of the diode 13. Furthermore, in a switching regulator according to a modification, a load determination circuit may include any of an inverter, a buffer, and a comparison circuit in accordance with a configuration of a variable inductance circuit. Furthermore, in a switching regulator according to a modification, a variable inductance circuit may include a plurality of coils connected in series or in parallel, in place of the first and second coils. Furthermore, in a switching regulator according to a modification, a switching regulator IC may include a control circuit and a load determination circuit.

Although the present invention is described in detail in the above, the above description is exemplary in all of the aspects and is not restrictive. It is understood that various other changes and modification can be derived without going out of the present invention.

What is claimed is:

1. A switching regulator comprising:
   a switching element;
   a rectifier element;
   an output capacitor having one electrode connected to an output terminal;
   a control circuit configured to supply a pulse width modulation signal in accordance with a voltage of the output terminal to a control terminal of the switching element;
   a load determination circuit configured to output a determination signal in accordance with a load, based on a voltage of the control terminal of the switching element; and
   a variable inductance circuit including a plurality of coils and having an inductance value which is switchable based on the determination signal,
   wherein the load determination circuit includes an integration circuit configured by a resistor and a capacitor and configured to output an average voltage of the voltage of the control terminal of the switching element.

2. The switching regulator according to claim 1, wherein the variable inductance circuit includes:
   a first coil;
   a second coil; and
   a second switching element connected in parallel with the second coil and configured to turn on when the determination signal indicates a heavy load and to turn off when the determination signal indicates a light load, and
   the first coil is connected in series with a parallel connection circuit of the second coil and the second switching element.

3. The switching regulator according to claim 1, wherein the variable inductance circuit includes:
   a first coil;
   a second coil; and
   a second switching element connected in series with the second coil and configured to turn on when the determination signal indicates a heavy load and to turn off when the determination signal indicates a light load, and
   the first coil is connected in parallel with a series connection circuit of the second coil and the second switching element.

4. The switching regulator according to claim 1, wherein the load determination circuit further includes an inverter configured to output the determination signal based on an output signal of the integration circuit.

5. The switching regulator according to claim 1, wherein the load determination circuit further includes a buffer configured to output the determination signal based on an output signal of the integration circuit.

6. The switching regulator according to claim 1, wherein the load determination circuit further includes:
   a resistor divider circuit configured to generate a comparison target voltage based on a reference voltage; and
   a comparison circuit configured to compare an output voltage of the integration circuit with the comparison target voltage to output the determination signal.

7. The switching regulator according to claim 1, wherein
   a first terminal of the variable inductance circuit is connected to an input terminal,
   a second terminal of the variable inductance circuit, a first conduction terminal of the switching element, and a first terminal of the rectifier element are connected to a first node,
   a second terminal of the rectifier element is connected to the output terminal, and
   a second conduction terminal of the switching element and another electrode of the output capacitor are grounded.

8. The switching regulator according to claim 1, wherein
   a first conduction terminal of the switching element is connected to an input terminal,
   a first terminal of the rectifier element and another electrode of the output capacitor are grounded,
   a second conduction terminal of the switching element, a second terminal of the rectifier element, and a first terminal of the variable inductance circuit are connected to a first node, and
   a second terminal of the variable inductance circuit is connected to the output terminal.

9. The switching regulator according to claim 1, wherein
   a first conduction terminal of the switching element is connected to an input terminal,
   a first terminal of the rectifier element is connected to the output terminal,
   a second conduction terminal of the switching element, a second terminal of the rectifier element, and a first terminal of the variable inductance circuit are connected to a first node, and
   a second terminal of the variable inductance circuit and another electrode of the output capacitor are grounded.

10. The switching regulator according to claim 1, wherein the rectifier element is a diode.

\* \* \* \* \*